(12) United States Patent
Eppich

(10) Patent No.: US 8,354,317 B2
(45) Date of Patent: Jan. 15, 2013

(54) RELAXED-PITCH METHOD OF ALIGNING ACTIVE AREA TO DIGIT LINE

(75) Inventor: Anton P. Eppich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 13/045,325

(22) Filed: Mar. 10, 2011

(65) Prior Publication Data
US 2011/0156116 A1   Jun. 30, 2011

Related U.S. Application Data

(63) Continuation of application No. 12/434,912, filed on May 4, 2009, now Pat. No. 7,915,116, which is a continuation of application No. 11/153,038, filed on Jun. 14, 2005, now Pat. No. 7,541,632.

(51) Int. Cl.
H01L 21/8242 (2006.01)
(52) U.S. Cl. ................ 438/239; 257/E27.087
(58) Field of Classification Search .......... 438/239; 257/E27.087
See application file for complete search history.

(56) References Cited

U.S. PATENT DOCUMENTS

| | | |
|---|---|---|
| 3,731,287 A | 5/1973 | Seely et al. |
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,776,922 A | 10/1988 | Bhattacharyya et al. |
| 4,838,991 A | 6/1989 | Cote et al. |
| 5,024,959 A | 6/1991 | Pfiester |
| 5,295,092 A | 3/1994 | Hotta |
| 5,328,810 A | 7/1994 | Lowrey et al. |
| 5,330,879 A | 7/1994 | Dennison |
| 5,514,885 A | 5/1996 | Myrick |
| 5,638,318 A | 6/1997 | Seyyedy |
| 5,677,865 A | 10/1997 | Seyyedy |

(Continued)

FOREIGN PATENT DOCUMENTS
DE   280851   7/1990
(Continued)

OTHER PUBLICATIONS

U.S. Appl. No. 11/216,477, filed Aug. 31, 2005.
(Continued)

*Primary Examiner* — Bradley K Smith
*Assistant Examiner* — Amar Movva
(74) *Attorney, Agent, or Firm* — Knobbe Martens Olson & Bear LLP

(57) ABSTRACT

According to one aspect of the invention, a memory device is disclosed. The memory device comprises a substantially linear active area comprising a source and at least two drains defining a first axis. The memory device further comprises at least two substantially parallel word lines, at least a portion of a first word line located between a first drain and the source, and at least a portion of a second word line located between a second drain and the source, which word lines define a second axis. The memory device further comprises a digit line coupled to the source, wherein the digit line forms a substantially zig-zag pattern.

24 Claims, 2 Drawing Sheets

U.S. PATENT DOCUMENTS

| | | | |
|---|---|---|---|
| 5,680,344 | A | 10/1997 | Seyyedy |
| 5,700,733 | A | 12/1997 | Manning |
| 5,789,269 | A | 8/1998 | Mehta et al. |
| 5,795,830 | A | 8/1998 | Cronin et al. |
| 5,895,238 | A | 4/1999 | Mitani |
| 5,913,116 | A | 6/1999 | Gardner et al. |
| 5,963,803 | A | 10/1999 | Dawson et al. |
| 5,994,743 | A | 11/1999 | Masuoka |
| 6,004,862 | A | 12/1999 | Kim et al. |
| 6,005,800 | A | 12/1999 | Koch et al. |
| 6,010,946 | A | 1/2000 | Hisamune et al. |
| 6,042,998 | A | 3/2000 | Brueck et al. |
| 6,057,573 | A | 5/2000 | Kirsch et al. |
| 6,063,688 | A | 5/2000 | Doyle et al. |
| 6,071,789 | A | 6/2000 | Yang et al. |
| 6,111,782 | A | 8/2000 | Sakakima et al. |
| 6,141,204 | A | 10/2000 | Schuegraf et al. |
| 6,150,211 | A | 11/2000 | Zahurak |
| 6,157,064 | A | 12/2000 | Huang |
| 6,165,833 | A | 12/2000 | Parekh et al. |
| 6,175,146 | B1 | 1/2001 | Lane et al. |
| 6,211,044 | B1 | 4/2001 | Xiang et al. |
| 6,282,113 | B1 | 8/2001 | DeBrosse |
| 6,288,454 | B1 | 9/2001 | Allman et al. |
| 6,291,334 | B1 | 9/2001 | Somekh |
| 6,297,554 | B1 | 10/2001 | Lin |
| 6,348,380 | B1 | 2/2002 | Weimer et al. |
| 6,362,057 | B1 | 3/2002 | Taylor, Jr. et al. |
| 6,404,056 | B1 | 6/2002 | Kuge et al. |
| 6,423,474 | B1 | 7/2002 | Holscher |
| 6,424,561 | B1 | 7/2002 | Li et al. |
| 6,455,372 | B1 | 9/2002 | Weimer |
| 6,475,867 | B1 | 11/2002 | Hui et al. |
| 6,514,884 | B2 | 2/2003 | Maeda |
| 6,522,584 | B1 | 2/2003 | Chen et al. |
| 6,545,904 | B2 | 4/2003 | Tran |
| 6,548,396 | B2 | 4/2003 | Naik et al. |
| 6,573,030 | B1 | 6/2003 | Fairbairn et al. |
| 6,602,779 | B1 | 8/2003 | Li et al. |
| 6,632,741 | B1 | 10/2003 | Clevenger et al. |
| 6,638,441 | B2 | 10/2003 | Chang et al. |
| 6,667,237 | B1 | 12/2003 | Metzler |
| 6,673,684 | B1 | 1/2004 | Huang et al. |
| 6,686,245 | B1 | 2/2004 | Mathew et al. |
| 6,689,695 | B1 | 2/2004 | Lui et al. |
| 6,699,763 | B2 | 3/2004 | Grider et al. |
| 6,706,571 | B1 | 3/2004 | Yu et al. |
| 6,709,807 | B2 | 3/2004 | Hallock et al. |
| 6,734,107 | B2 | 5/2004 | Lai et al. |
| 6,744,094 | B2 | 6/2004 | Forbes |
| 6,768,663 | B2 | 7/2004 | Ogata |
| 6,773,998 | B1 | 8/2004 | Fisher et al. |
| 6,777,725 | B2 | 8/2004 | Willer et al. |
| 6,825,529 | B2 | 11/2004 | Chidambarrao et al. |
| 6,893,972 | B2 | 5/2005 | Rottstegge et al. |
| 6,908,800 | B1 | 6/2005 | Kim et al. |
| 6,946,709 | B2 | 9/2005 | Yang |
| 7,042,047 | B2 | 5/2006 | Eppich |
| 7,105,089 | B2 | 9/2006 | Fanselow et al. |
| 7,214,629 | B1 | 5/2007 | Luo et al. |
| 7,238,580 | B2 | 7/2007 | Orlowski et al. |
| 7,541,632 | B2 * | 6/2009 | Eppich ............ 257/296 |
| 7,915,116 | B2 * | 3/2011 | Eppich ............ 438/239 |
| 2001/0005631 | A1 | 6/2001 | Kim et al. |
| 2002/0042198 | A1 | 4/2002 | Bjarnason et al. |
| 2002/0063110 | A1 | 5/2002 | Cantell et al. |
| 2002/0130348 | A1 | 9/2002 | Tran |
| 2002/0158273 | A1 | 10/2002 | Satoh et al. |
| 2003/0044722 | A1 | 3/2003 | Hsu et al. |
| 2003/0119307 | A1 | 6/2003 | Bekiaris et al. |
| 2003/0157436 | A1 | 8/2003 | Manger et al. |
| 2003/0207207 | A1 | 11/2003 | Li |
| 2003/0230234 | A1 | 12/2003 | Nam et al. |
| 2004/0000534 | A1 | 1/2004 | Lipinski |
| 2004/0023475 | A1 | 2/2004 | Bonser et al. |
| 2004/0023502 | A1 | 2/2004 | Tzou et al. |
| 2004/0043623 | A1 | 3/2004 | Lin et al. |
| 2004/0053475 | A1 | 3/2004 | Sharma |
| 2004/0106257 | A1 | 6/2004 | Okamura et al. |
| 2005/0164443 | A1 | 7/2005 | Kim et al. |
| 2006/0028859 | A1 | 2/2006 | Forbes |
| 2006/0043473 | A1 | 3/2006 | Eppich |
| 2006/0046200 | A1 | 3/2006 | Abatchev et al. |
| 2006/0046201 | A1 | 3/2006 | Sandhu et al. |
| 2006/0046407 | A1 | 3/2006 | Juengling |
| 2006/0046422 | A1 | 3/2006 | Tran et al. |
| 2006/0046484 | A1 | 3/2006 | Abatchev et al. |
| 2006/0083996 | A1 | 4/2006 | Kim |
| 2006/0157795 | A1 | 7/2006 | Chen et al. |
| 2006/0211260 | A1 | 9/2006 | Tran et al. |
| 2006/0231900 | A1 | 10/2006 | Lee et al. |
| 2006/0263699 | A1 | 11/2006 | Abatchev et al. |
| 2006/0273456 | A1 | 12/2006 | Sant et al. |
| 2006/0281266 | A1 | 12/2006 | Wells |
| 2006/0286740 | A1 | 12/2006 | Lin et al. |
| 2007/0145450 | A1 | 6/2007 | Wang et al. |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 | 12/2002 |
| WO | WO 2005/010973 | 2/2005 |
| WO | WO 2006/026699 | 3/2006 |

OTHER PUBLICATIONS

Bergeron et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages, 2004.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Lim et al.; "Atomic Layer Deposition of Transition Metals"; Nature vol. 2, Nov. 2003, pp. 749-753.

Oehrlein et al., "Pattern transfer into low dielectric materials by high-density plasma etching," Solid State Tech., May 2000, 8 pages.

Pohm et al., "Experimental and analytical properties of 0.2 micron wide, multi-layer, GMR, memory elements," Transactions on Magnetics, Sep. 1996, pp. 4645-4647, vol. 32, No. 5.

USPTO; Office Action dated Jul. 19, 2007, from related application U.S. Appl. No. 11/153,038, filed Jun. 14, 2005.

USPTO; Final Office Action dated Apr. 15, 2008, from related application U.S. Appl. No. 11/153,038, filed Jun. 14, 2005.

USPTO; Advisory Office Action dated Jun. 30, 2008, from related application U.S. Appl. No. 11/153,038, filed Jun. 14, 2005.

USPTO; Office Action dated Oct. 17, 2008, from related application U.S. Appl. No. 11/153,038, filed Jun. 14, 2005.

USPTO; Office Action dated Jul. 22, 2010, from related application U.S. Appl. No. 12/434,912, filed May 4, 2009.

* cited by examiner

RELAXED-PITCH METHOD OF ALIGNING ACTIVE AREA TO DIGIT LINE

CROSS-REFERENCE TO RELATED APPLICATION

This application is a continuation application of U.S. patent application Ser. No. 12/434,912, filed May 4, 2009, now U.S. Pat. No. 7,915,116, issued on Mar. 29, 2011, which is a continuation application of U.S. application Ser. No. 11/153,038, filed Jun. 14, 2005, now U.S. Pat. No. 7,541,632, issued on Jun. 2, 2009, the entirety of which is incorporated by reference herein.

FIELD OF THE INVENTION

This invention relates generally to integrated circuit design and, more particularly, to a layout for minimizing area while maximizing feature size.

BACKGROUND OF THE INVENTION

As a consequence of many factors, including demands for increased portability, computing power, memory capacity and energy efficiency in modern electronics, integrated circuits are continuously being reduced in size. To facilitate these size reductions, the sizes of the constituent features, such as electrical devices and interconnect line widths, that form the integrated circuits, are also constantly being decreased.

The trend of decreasing feature size is most evident in memory circuits or devices such as dynamic random access memories (DRAMs), static random access memories (SRAMs), ferroelectric (FE) memories, etc. To take one example, DRAM typically comprises millions of identical circuit elements, known as memory cells. In one application, a pair of memory cells comprises three electrical devices: two storage capacitors and an access field transistor having a single source shared by the memory cells, two gates, two channels and two drains. The pair of memory cells, therefore, has two addressable locations that can each store one bit (binary digit) of data. A bit can be written to one of the cells' locations through the transistor and read by sensing charge on the drain electrode from the source electrode site.

By decreasing the sizes of constituent electrical devices and the conducting lines that access them, the sizes of the memory devices incorporating these features can be decreased. Storage capacities for a given chip area can thus be increased by fitting more memory cells onto memory devices.

The continual reduction in feature size places ever greater demands on the techniques used to form the features. One well-known technique is photolithography, commonly used to pattern features, such as conductive lines, on a substrate. The concept of pitch can be used to describe the size of these features. Pitch is defined as the distance between identical points in two neighboring features. Adjacent features are typically separated by a material, such as an insulator. As a result, pitch can be viewed as the sum of the width of the feature and of the width of the space or material separating that feature from a neighboring feature. Due to optical factors, such as lens limitations and light or radiation wavelength, photolithographic techniques have minimum pitches below which a particular photolithographic technique cannot reliably form features. This minimum pitch is commonly referred to by a variable defining one half of the minimum pitch, or feature size F. This variable is often referred to as a "resolution." The minimum pitch, 2F, places a theoretical limit on feature size reduction.

Pitch doubling is one method for extending the capabilities of photolithographic techniques beyond their minimum pitch, achieving a pitch of F. Two pitch doubling methods are illustrated and described in U.S. Pat. No. 5,328,810, issued to Lowrey et al., and in U.S. patent application Ser. No. 10/934,778, filed Sep. 2, 2004 by Abatchev et al., the disclosures of which are incorporated herein by reference in their entirety. Such techniques can successfully reduce the potential photolithographic pitch; however, they also increase the cost of manufacturing.

Another method for improving the density possible using conventional photolithographic techniques is to change the layout of a memory device in order to fit more memory cells in the same area without changing the pitch. Using such a method, the size of the memory device can be reduced without exceeding the minimum pitch, 2F, dictated by optical limitations. Alternatively, the memory device may be configured to hold more memory cells, while maintaining a constant pitch.

These two methods, pitch doubling and memory layout changes, are difficult to employ harmoniously. Accordingly, there is a need for a method of forming memory devices that have greater pitch between certain elements, even while the size of the memory devices shrinks or the density of the memory devices increases. Such a memory design or layout is especially desirable in conjunction with pitch multiplication, when the small pitch of the pitch-multiplied elements can potentially strain the capabilities of photolithographic techniques to adequately define and separate other elements of the memory devices.

SUMMARY OF THE INVENTION

According to one aspect of the invention, a memory device is disclosed. The memory device comprises a substantially linear active area comprising a source and at least two drains defining a first axis. The memory device further comprises at least two substantially parallel word lines, at least a portion of a first word line located between a first drain and the source, and at least a portion of a second word line located between a second drain and the source, which word lines define a second axis. The memory device further comprises a digit line coupled to the source, wherein the digit line forms a substantially zig-zag pattern.

According to another aspect of the invention, another memory device is disclosed. The memory device comprises a substantially linear active area comprising a source and a drain defining a first axis. The memory device further comprises a word line, at least a portion of which is located between the source and the drain, which word line defines a second axis. The memory device further comprises a digit line coupled to the source, wherein the digit line forms a substantially zig-zag pattern, and wherein a third axis is defined perpendicularly to the second axis, and wherein an acute angle between the first and third axes is within a range of 5° to 80°.

According to another aspect of the invention, an integrated circuit is disclosed. The integrated circuit comprises an active area defining a first axis, the active area comprising a source and at least two drains. The integrated circuit further comprises at least two substantially parallel word lines crossing the active area, the word lines defining a second axis. The integrated circuit further comprises a digit line coupled to the source, wherein a third axis runs perpendicularly to the second axis, and wherein an acute angle between the first and third axes is within the range of 5° to 80°.

According to another aspect of the invention, a system is disclosed. The system comprises at least two memory cells sharing a source, the at least two memory cells defining a first longitudinal axis. The system further comprises at least two substantially parallel word lines intersecting the at least two memory cells, which two word lines define a second axis. The system further comprises a digit line coupled to the source. A third axis, perpendicular to the second axis, defines an acute angle with the first axis of between about 20° and 30°.

According to another aspect of the invention, another memory device is disclosed. The memory device comprises at least two substantially linear active areas, each active area comprising a source and a drain, which active areas form a first substantially zig-zag pattern. The memory device further comprises a word line, at least a portion of which intersects the first active area. The memory device further comprises a digit line coupled to the source of each active area, wherein the digit line forms a second substantially zig-zag pattern that repeatedly intersects the first substantially zig-zag pattern.

According to another aspect of the invention, a method of manufacturing a memory device is disclosed. The method comprises the following steps: A substrate is provided. At least one substantially linear active area is defined within the substrate, said active area comprising a source and a drain, said source and drain defining a first axis. At least one pair of word lines is defined within the substrate by a pitch-doubling technique, said pair of word lines defining a second axis along its longitudinal axis and a third axis running perpendicularly to the second axis. An acute angle between the first and third axes is within the range of 5° to 80°. Finally, at least one digit line is defined above the substrate, with at least a portion of the digit line extending above the source. The digit line preferably has legs extending in alternating directions.

According to another aspect of the invention, an integrated circuit is disclosed. The integrated circuit has a memory layout including at least two active areas, each active area comprising a source and a drain. The memory layout further includes a word line, at least a portion of which intersects the first active area. The memory layout further includes a digit line coupled to the source of each active area, wherein the digit line has legs defining different orientations with each source, and wherein the at least two active areas form a substantially zig-zag pattern.

According to another aspect of the invention, a memory chip is disclosed. The memory chip comprises at least three substantially linear transistors. The memory chip further comprises at least two parallel word lines, a first word line intersecting a first of the at least three transistors, and a second word line intersecting a second and third of the at least three transistors. The memory chip further comprises at least two digit lines, a first digit line intersecting the first and second transistors, and a second digit line intersecting the third transistor, wherein a first leg of the first digit line near the second transistor forms an alternating pattern with a second leg of the first digit line near the first transistor, wherein the first transistor forms an alternating pattern with the second transistor, and wherein the second and third transistors are substantially parallel.

BRIEF DESCRIPTION OF THE DRAWINGS

The invention will be better understood from the detailed description of the preferred embodiments and from the appended drawings, which are meant to illustrate and not to limit the invention.

DETAILED DESCRIPTION OF THE PREFERRED EMBODIMENT

While the preferred embodiments of the present invention are illustrated in combination with a pitch doubling technique, it should be understood that the circuit design of these preferred embodiments may be incorporated into any integrated circuit. In particular, they may be advantageously applied to form any device having an array of electrical devices, including logic or gate arrays and volatile or non-volatile memory devices, such as DRAMs, RAMs or flash memory, and systems (e.g., computers) incorporating such devices.

The design and functioning of one memory device, a DRAM, laid out according to one embodiment of the present invention is illustrated in the figures, and described in greater detail below.

Figure 1:
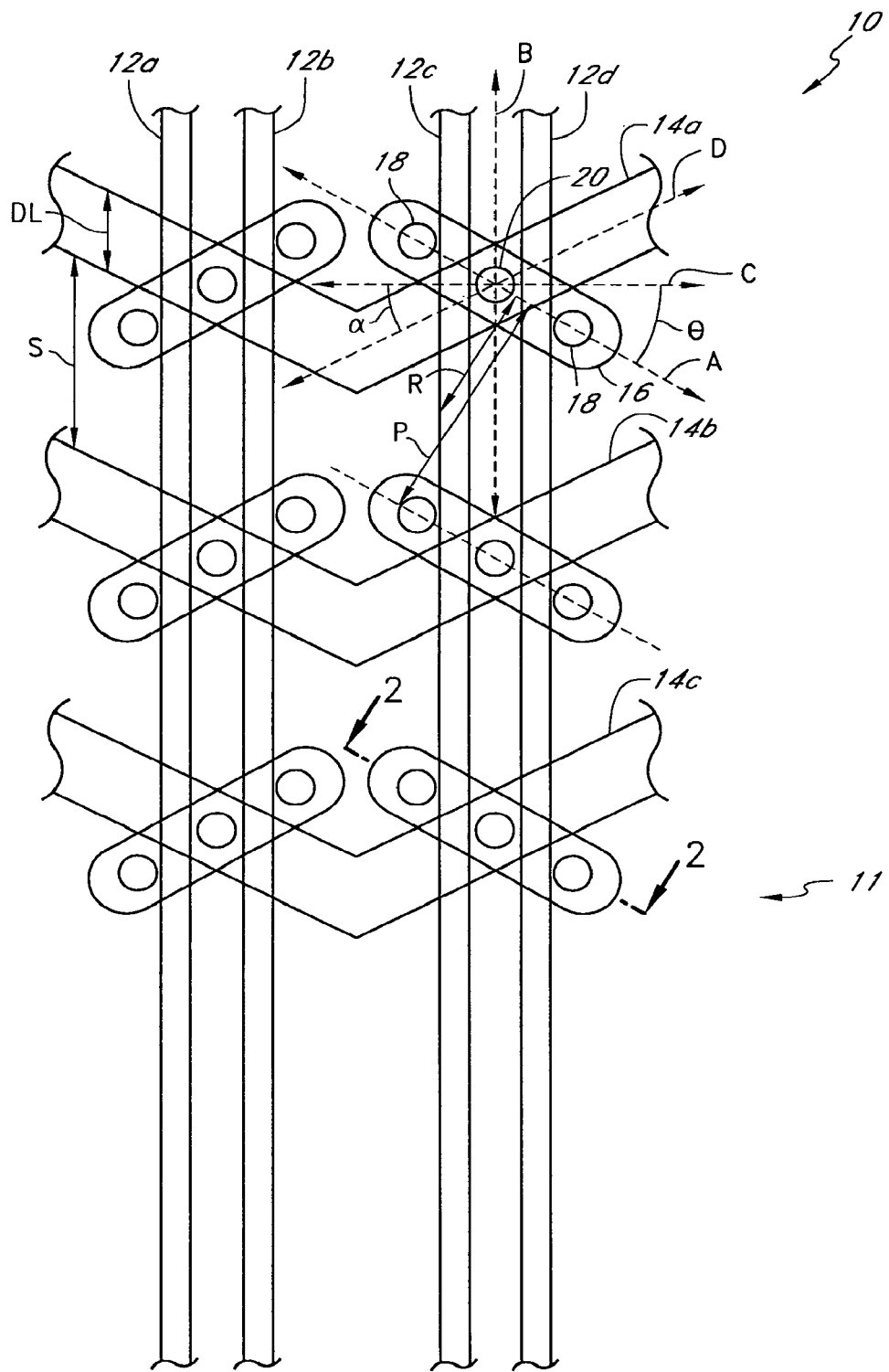
FIG. 1 is a schematic view of a memory device, laid out in accordance with a preferred embodiment of the invention.

FIG. 1 shows a portion of a memory device 10. This schematic layout illustrates the various electrical devices and other components that form the memory device 10. Of course, many of these components would be indistinguishable in a purely visual representation, and some of the components shown in FIG. 1 are artificially distinguished from other components in order to highlight their functionality. The memory device 10 is built on a substrate 11, which forms the lowest level of semiconductor material in which electrical devices are formed. The substrate 11 typically comprises silicon. Of course, other suitable materials (e.g., other group III-V elements) may also be used, as is well-known to those skilled in the art. When describing the other components, their depth or height may be most easily understood with reference to the top surface of the substrate 11, best seen in FIG. 2.

Four elongated word lines 12a, 12b, 12c, 12d are also shown in FIG. 1 extending along the memory device 10. In a preferred embodiment, these word lines 12 were formed using a pitch doubling technique. In particular, these word lines 12 are preferably formed by one of the methods disclosed in U.S. patent application Ser. No. 10/934,778. Using such a technique, the pitch of the resulting features may be one half the minimum pitch defined by the photolithographic technique.

In one preferred embodiment, pitch doubling may be performed by the following sequence of steps, as is well understood by those skilled in the art. First, photolithography may be used to form a pattern of lines in a photoresist layer overlying a layer of an expendable material and a substrate. This photolithographic technique achieves a pitch between adjacent lines of 2F, as disclosed above, which pitch is limited by the optical characteristics of photolithography. The width of each of these lines is also defined as F, as would be well understood by those skilled in the art. The pattern may then be transferred by an etching step (preferably anisotropic) to the lower layer of expendable material, thereby forming placeholders, or mandrels in the lower layer. The photoresist lines can then be stripped, and the mandrels can be isotropically etched to increase the distance between neighboring mandrels. Preferably, the distance between the neighboring mandrels is increased from F to 3F/2. A conformal layer of spacer material may then be deposited over the mandrels. This layer of material covers both horizontal and vertical surfaces of the mandrels. Spacers, i.e., material extending from sidewalls of another material, are therefore formed on the sides of the mandrels by preferentially etching the spacer material from the horizontal surfaces in a directional spacer etch. The remaining mandrels are then removed, leaving behind only the spacers, which together may act as a mask for patterning. Thus, where a given pitch, 2F, formerly included a pattern defining one feature and one space, the same width now includes two features and two spaces defined by the spacers. As a result, the smallest feature size achievable with a given photolithographic technique is effectively decreased.

Thus, in the present application, whereas the photolithographic technique may resolve a pitch of 2F, the features, i.e. word lines 12 in the instant example, have a pitch of F. The word lines 12 are defined by a width of about F/2, and adjacent word lines 12a, 12b or 12c, 12d are separated by the same width, F/2. Meanwhile, as a byproduct of the pitch-doubling technique, the separation between the spaced-apart word lines 12b, 12c is 3F/2. In a preferred embodiment, an isolation trench is filled with an insulator and lies within this separation between these word lines 12b, 12c; however, in other embodiments, this isolation trench need not be present. Of course, the particular pitch used to define the word lines is only an example. In other embodiments, the word lines may be fabricated by more conventional techniques, and pitch doubling need not be used. In one embodiment, for example, the word lines may each have a width of F and may be separated by F, 2F, 3F or some other width. In still other embodiments, the word lines need not be formed in pairs either. For example, in one embodiment, only one word line need pass through each active area.

The entire length of the word lines 12 is not visible in FIG. 1, but, in a typical implementation, each word line 12 may extend across hundreds, thousands or millions of transistors. At the edges of the word lines 12, as is well-known to those of skill in the art, the word lines 12 are typically electrically coupled to a device, such as a power source, that can place a current across the word line 12. Often, the power sources for the word lines 12 are indirectly coupled to a CPU through a memory controller.

In one embodiment, the word lines 12 comprise a p-type semiconductor, such as silicon doped with boron. In other embodiments, the word lines 12 may comprise an n-type semiconductor, metal silicide, tungsten or other similarly behaving material, as is well-known to those of skill in the art. In some embodiments, the word lines 12 may comprise a variety of materials, in a layered, mixed or chemically bonded configuration.

The horizontal herringbone patterns seen in FIG. 1 are formed by digit lines 14a, 14b, 14c forming complementary zig-zags. In one exemplary embodiment, the width in the y-dimension of each of these digit lines, illustrated as DL in FIG. 1, is equal to F. No pitch doubling has been used to form these exemplary digit lines 14. Adjacent digit lines 14a, 14b or 14b, 14c are separated, in a preferred embodiment, by a width in the y-dimension, illustrated as S in FIG. 1, equal to 2F. Thus, the digit lines 14 have a pitch in the y-dimension of 3F. Of course, in other embodiments, different widths and spacing are possible.

As with the word lines 12, the entire length of the digit lines 14 is also not visible in FIG. 1, and the digit lines 14 typically extend across many transistors. At the edges of the digit lines 14, as is well-known to those of skill in the art, the digit lines 14 are typically electrically coupled to sense amplifiers, and thereby to a power or voltage source, that can place a current across them. Often, the power sources for the digit lines 14 are also indirectly coupled to a CPU through a memory controller.

In one embodiment, the digit lines 14 comprise a conducting metal, such as tungsten, copper or silver. In other embodiments, other conductors or semiconductors may be used, as is well-known to those of skill in the art.

The other features visible in FIG. 1 are the active areas 16, illustrated within curvilinear rectangles, which form a complementary herringbone pattern to that formed by the digit lines 14. These rectangles represent a doped region or well within the substrate 11; however, in other embodiments, these rectangles need not represent physical structures or materials within or upon the memory device 10 and substrate 11. The active areas 16 define those portions of the memory device 10 that contain field effect transistors. In one preferred embodiment, these active areas each comprise two drains 18 and one source 20. The source and drains may be larger or smaller than illustrated in FIG. 1, as is well known to those of skill in the art. They may also be fabricated in any of a number of ways well-known to those of skill in the art.

In another embodiment, the active areas may comprise one source and one drain, wherein the source is formed near the digit line, and the drain is separated from the source by a word line. In such an embodiment, the memory device may be configured similarly to the memory device 10 in FIG. 1, but there need only be one word line passing through each active area. Of course, in another embodiment, an active area may comprise one source and one drain, and the memory device may further comprise two word lines extending near the active area, configured similarly to the paired word lines 12c, 12d shown in FIG. 1. In such an embodiment, the two word lines may both extend between the source and drain, and provide redundant control of the transistor.

As illustrated, a digit line 14 runs proximal to, and preferably above (see FIG. 2), each source 20 that lies in the digit line's row. Meanwhile, each source 20 is separated to either side from its adjacent drains 18 by word lines 12. In one embodiment, the source 20 and drains 18 comprise an n-type semiconducting material, such as silicon doped with phosphorous or antimony. In other embodiments, the source 20 and drains 18 may comprise a p-type semiconductor, or they may be fabricated from other materials, as is well-known to those of skill in the art. In fact, the source 20 and drains 18 need not be fabricated from the same compounds.

The functioning of memory device 10 would be obvious to one of skill in the art, and is briefly discussed with reference to FIG. 2, which shows a cross-sectional view of one of the active areas 16. For a further discussion of the basic manner in which DRAMs function, U.S. Pat. No. 3,731,287, issued to Seely et al., which is incorporated by reference herein in its entirety, discusses DRAMs in greater detail.

Figure 2:
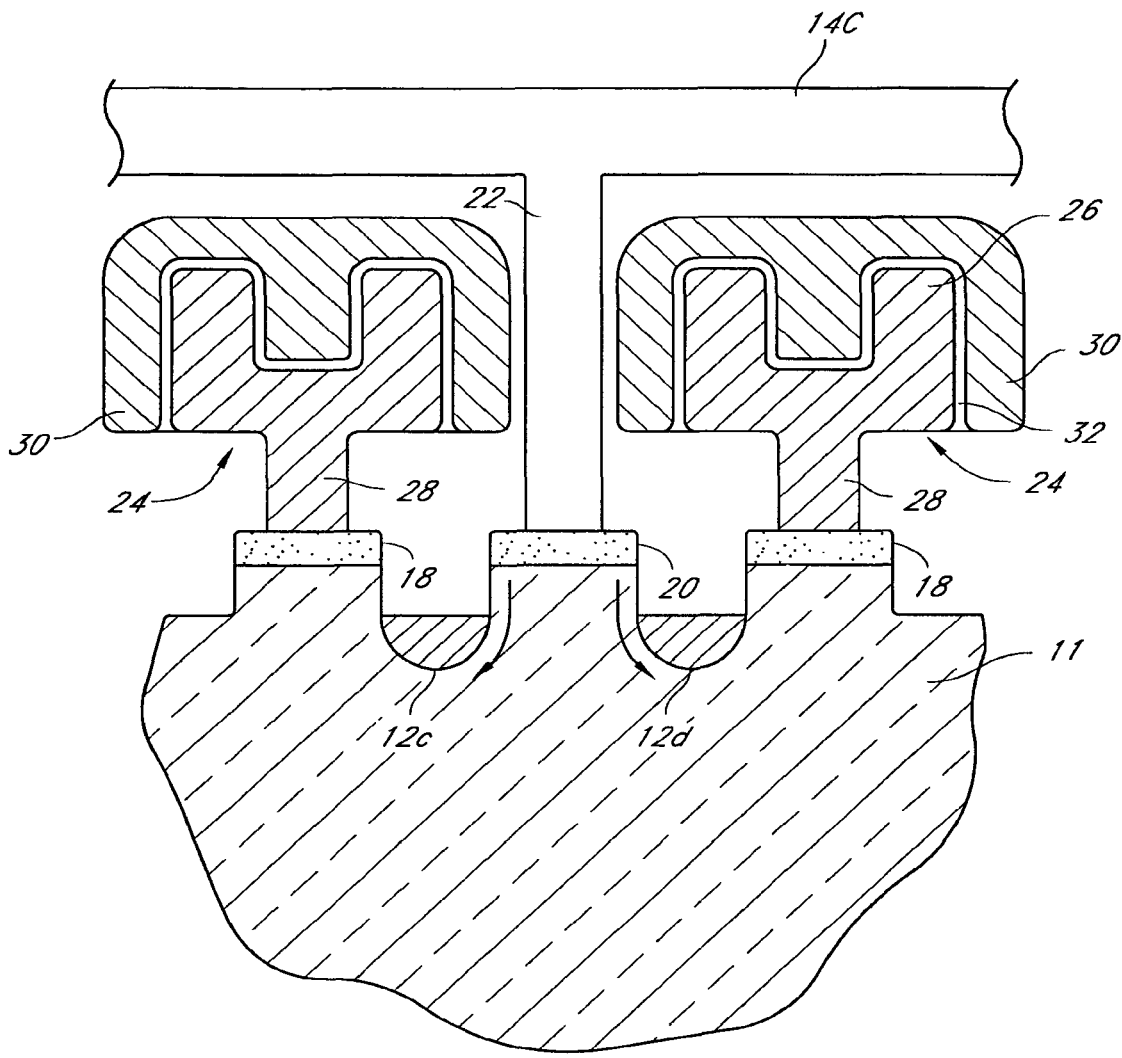
FIG. 2 is a schematic, cross-sectional side view of the memory device of FIG. 1, in accordance with a preferred embodiment of the invention.

As shown in FIG. 2, the drains 18 and source 20 may comprise protrusions from the relatively flat, upper surface of the substrate 11. In one preferred embodiment, the source 20 and drains 18 are fabricated as one-piece with the substrate 11, and are raised relative to the surface of the substrate 11 by etching a monolithic wafer or substrate, or by epitaxial deposition using techniques well-known to those of skill in the art.

In one embodiment, at least a portion of digit line 14c is located above the upper surface of source 20. As illustrated in FIG. 2, the source 20 is electrically coupled to the digit line 14c by a digit line plug 22. Meanwhile, the source 20 is separated from the two drains 18 by word lines 12c, 12d. The word lines 12c, 12d are preferably embedded in the substrate 11, extending downwards from the surface. The drains 18 are, in turn, electrically coupled to storage capacitors 24, and, in particular, to the lower electrode 26 of the storage capacitors 24, by contact plugs 28. In a preferred embodiment, the storage capacitors 24 comprise a lower electrode 26 separated from a reference electrode 30 by a dielectric material 32. In this configuration, these stacked storage capacitors 24 function in a manner well known to those of skill in the art. As illustrated, the storage capacitors 24 are preferably located above the plane of the substrate 11, although trench capacitors can be used in other arrangements.

In one embodiment, one side of every storage capacitor 24 forms a reference electrode 30, while the lower electrode 26 is electrically coupled to an associated drain 18. The word lines 12c, 12d function as gates in the field effect transistors they pass through, while the digit line 14c functions as a signal for the sources to which it is electrically coupled. Thus, the word lines 12c, 12d preferably control access to the storage capacitors 24 coupled to each drain 18, by allowing or preventing the signal (representing logic "0" or logic "1") carried on the digit line 14c to be written to or read from the storage capacitors 24. Thus, each of the two capacitors 24 connected to an associated drain 18 can contain one bit of data (i.e., a logic "0" or logic "1"). In a memory array, the combination of the digit line and word line that are selected can uniquely identify the storage capacitor 24 to or from which data should be written or read.

Turning back then to FIG. 1, the design and geometry of the memory device 10 may be discussed in further detail. In the upper right hand corner of FIG. 1, a number of axes have been illustrated. These axes are generally aligned with the longitudinal axes of circuit elements forming the memory device 10, and are illustrated to more clearly show the angles formed between various electrical devices and components. Axis A parallels the longitudinal axis of active area 16. The drains 18 and source 20 of each active area 16 preferably have a substantially linear relationship that may be used to define a longitudinal axis. As illustrated, a plurality of active areas 16 connected to the word lines 12c, 12d are substantially parallel, and a plurality of active areas 16 connected to the word lines 12a, 12b are similarly substantially parallel to one another. It will be understood, of course, that the drains 18 and source 20 need not form an absolutely straight line, and indeed a substantial angle may be defined by these three points. In some embodiments, therefore, the axis A may be defined by the two drains 18, or by the source 20 and only one of the drains 18, or in a number of other ways that would be clearly understood by those skilled in the art. In other embodiments, in which the active area comprises a single drain and a single source, the axis A may be defined by a line between the single drain and single source.

Axis B parallels the longitudinal axes of word lines 12c, 12d. As may be seen in FIG. 1, the word lines 12a, 12b, 12c, 12d run substantially parallel to one another, each defining roughly parallel axes. Of course, as described above, the word lines 12 need not be absolutely straight nor strictly parallel, but preferably they do not cross one another within the array. Axis C represents a line in the plane of the substrate 11 that extends perpendicularly to axis B.

Finally, axis D parallels the longitudinal axis of a portion of the digit line 14a extending near a source 20. In the illustrated embodiment, this portion of the digit line 14a forms a substantially straight line through the source 20, and clearly defines axis D in the region proximal the source 20. Each of these substantially straight segments of the digit line 14a forms a leg, and the digit line 14a may be seen to have legs extending in alternating directions through different sources, such that the legs form a substantially zig-zag pattern. In other embodiments, however, the digit line 14a may be curved near the source 20, and the axis D may be defined in other ways well-known to those skilled in the art, for example, along a tangent to the curve. Just as the active areas 16 contacting the same word lines 12c, 12d are parallel, the legs of the digit lines 14a, 14b, 14c also form generally parallel axes D when crossing over word lines 12c, 12d. Thus, in a preferred embodiment, each axis A of the active areas 16 that intersect the same word lines 12c, 12d forms a similar angle with each axis D of the digit line legs near those active areas 16. The acute angle formed between the digit lines 14 and active areas 16 is double the angle $\theta$, called out in FIG. 1, preferably between about 40° and 60°, more preferably about 53.2°.

In a preferred embodiment, illustrated in FIG. 1, an acute angle is formed between axis C and axis A. In a more preferred embodiment, the acute angle $\theta$, defined between axis A and axis C is 26.6°. Given this preferred angle of 26.6°, the pitch, or minimum distance between adjacent active areas 16 contacting the same word lines may be found, and is illustrated in FIG. 1 as distance P. In a preferred embodiment, distance P is 2.68F, yielding a resolution, illustrated as distance R, of 1.34F (where the resolution is equal to one half the pitch). Such a large pitch may greatly reduce the costs of manufacturing memory device 10.

In a preferred embodiment, the digit lines 14 are also angled relative to the axis C, as illustrated in FIG. 1. The complementary angling of the active areas 16 and digit lines 14 facilitates the location of the contact plugs 28 extending between drains 18 and associated storage capacitors 24. Since these contact plugs 28 extend from the top surface of the drains 18 in the preferred embodiment (as illustrated in FIG. 2), the engineering is simplified if the digit lines 14 do not extend over the tops of the drains 18, limiting the potential height of the storage capacitors 24 and contact plugs 28. By angling the digit lines 14, the distance between a digit line 14 and drains 18 can be maximized, even while the digit line 14 substantially completely covers the source 20 of the same active area 16. In a more preferred embodiment, the acute angle $\alpha$, between the axis D and the axis C also equals 26.6°. As a result, the digit lines 14 are also separated by a pitch P, which, in the preferred embodiment, is equal to 2.68F.

In a further preferred embodiment, the digit lines 14 form a herringbone pattern, as shown in FIG. 1. The active areas 16 also form a herringbone pattern substantially opposite to the herringbone pattern formed by the digit lines 14. In other embodiments, of course, the digit lines 14 need not form a herringbone pattern, but may simply describe straight lines formed at an angle to axis C.

Of course, as is well-known in the art, the angles $\theta$ and $\alpha$ may have any of a number of values chosen to maximize the pitch of the electrical devices, and need not have the same value. As will be readily apparent to one of skill in the art, a minimum amount of calculation is needed to determine the optimum angles for a given circuit configuration in order to maximize the pitch. In one embodiment, at least one of the angles, $\theta$ and $\alpha$, is preferably between 5° and 80°. In a more preferred embodiment, at least one of the angles, $\theta$ and $\alpha$, is between 10° and 40°. In a still more preferred embodiment, at least one of the angles, $\theta$ and $\alpha$, is between 20° and 30°.

Similarly, as is well-known in the art, the distances between, and associated resolutions of the features of the memory device 10 may have a number of values defined by the angles, $\theta$ and $\alpha$, as well as the photolithographic techniques used to form other features of the memory device 10. As will be readily apparent to one of skill in the art, a minimum amount of calculation is needed to determine the distances and resolution given these other variables. In one embodiment, the distance is preferably between F and 4F, and the resolution is between F/2 and 2F. In a more preferred embodiment, the distance is between 2F and 4F, and the resolution is between F and 2F. In a still more preferred embodiment, the distance is between 2.5F and 3F, and the resolution is between 1.25F and 1.5F.

Although the present invention has been described with reference to its preferred embodiments, it is to be understood that the invention is not so limited.

What is claimed is:

1. A memory device comprising:
    at least one substantially linear active area within a substrate, said active area comprising a shared source, a first drain, and a second drain, the shared source, the first drain and the second drain defining a first axis;
    a first gate between the shared source and the first drain;
    a second gate between the shared source and the second drain;
    at least one pair of substantially parallel word lines within the substrate, said pair of word lines defining a second axis lengthwise wherein a first word line of the pair is coupled to the first gate, wherein a second word line of the pair is coupled to the second gate, wherein a third axis runs perpendicular to the second axis; and
    at least one digit line above the substrate in a substantially zig-zag pattern, wherein at least a portion of the digit line extends above and is coupled to the shared source, the portion defining a fourth axis, wherein an acute angle between the third axis and the fourth axis is within the range of 20° to 30°.

2. The memory device of claim 1, wherein the acute angle between the third axis and the fourth axis is about 26.6°.

3. The memory device of claim 1, wherein the acute angle between the third axis and the first axis is within the range of 20° to 30°.

4. The memory device of claim 3, wherein the acute angle between the third axis and the first axis is about 26.6°.

5. The memory device of claim 1, further comprising a second substantially linear active area comprising a second shared source and a third drain and a fourth drain, the second active area and the at least one active area forming a substantially herringbone-shaped pattern.

6. The memory device of claim 1, further comprising a third substantially linear active area comprising a third shared source and a fifth drain and a sixth drain, wherein the third substantially linear active area defines a fifth axis, wherein the fifth axis and first axis are substantially parallel, and wherein the third active area also intersects the at least one pair of substantially parallel word lines.

7. The memory device of claim 1, wherein the memory device comprises a dynamic random access memory (DRAM), wherein the first drain and the second drain are coupled to a first storage capacitor and to a second storage capacitor, respectively.

8. The memory device of claim 1, wherein the memory device wherein each word line of the pair has a first width and wherein the digit line has a width that is about double that of the first width.

9. A method of manufacturing a memory device, the method comprising:
    forming an access field transistor of a semiconductor substrate assembly, the access field transistor having a substantially linear active area defining a first axis, the substantially linear active area including a shared source, a first drain, and a second drain, the access field transistor also having a first gate disposed between the shared source and the first drain, and a second gate disposed between the shared source and the second drain;
    forming at least two substantially parallel word lines, at least a portion of a first word line located between the first drain and the shared source, wherein the first word line is coupled to the first gate, and at least a portion of a second word line located between the second drain and the shared source, wherein the second word line is coupled to the second gate, which word lines define a second axis lengthwise along the word lines, wherein a third axis runs perpendicular to the second axis; and
    forming a digit line coupled to the shared source, wherein the digit line forms a substantially zig-zag pattern, wherein at least a portion of the digit line near the shared source does not run perpendicular to the word lines at the shared source, the portion defining a fourth axis, wherein an acute angle between the third axis and the fourth axis is within the range of 20° to 30°.

10. The method of claim 9, wherein the acute angle between the third and fourth axes is about 26.6°.

11. The method of claim 9, wherein the acute angle between the third and first axes is within the range of 20° to 30°.

12. The method of claim 11, wherein the acute angle between the third and first axes is about 26.6°.

13. The method of claim 9, further comprising forming a second, substantially linear active area comprising a second source and at least two second drains, the second active area and the active area forming a substantially herringbone-shaped pattern.

14. The method of claim 9, further comprising forming a third, substantially linear active area comprising a third source and at least two third drains defining a fifth axis, wherein the fifth and first axes are substantially parallel, and wherein the third active area also intersects the two word lines.

15. The method of claim 9, wherein the memory device comprises a dynamic random access memory (DRAM), wherein the first drain and the second drain are coupled to a first storage capacitor and to a second storage capacitor, respectively.

16. The method of claim 9, wherein the at least two substantially parallel word lines each have a first width and wherein the digit line has a second width that is about double the first width, wherein the word lines are defined by a width that is less than a minimum resolution (F) of a photolithographic technique used to form the memory device.

17. The method of claim 9, wherein the at least two substantially parallel word lines each have a first width and wherein the digit line has a second width that is about double the first width, wherein at least one of the word lines has a width equal to approximately one half of a minimum resolution (F) of a photolithographic technique used to form the memory device.

18. The method of claim 9, further comprising forming the word lines by a pitch-doubling technique, wherein the at least two substantially parallel word lines each have a first width and wherein the digit line has a second width that is about double the first width.

19. The method of claim 9, forming a third, substantially linear active area comprising a third source and at least two third drains defining a fifth axis, wherein the fifth and first axes are substantially parallel, and wherein the third active area also intersects the two word lines, wherein a minimum distance between the third active area and the active area is equal to between one and four times a minimum resolution (F) of a photolithographic technique used to form the memory device.

20. The method of claim 19, wherein the minimum distance between the third active area and the active area is equal to between two and four times the minimum resolution (F) of the photolithographic technique used to form the memory device.

21. The method of claim 19, wherein the minimum distance between the third active area and the active area is equal to between 2.5 and three times the minimum resolution (F) of the photolithographic technique used to form the memory device.

22. The method of claim 19, wherein the minimum distance between the third active area and the active area is equal to 2.68 times a minimum resolution (F) of a photolithographic technique used to form the memory device.

23. The method of claim 19, wherein a resolution between the third active area and the active area is equal to 1.34 times a minimum resolution (F) of a photolithographic technique used to form the memory device.

24. The method of claim 9, wherein the at least two substantially parallel word lines each have a first width and wherein the digit line has a second width that is about double the first width.

* * * * *